(12) United States Patent
Iyoda et al.

(10) Patent No.: US 7,387,741 B2
(45) Date of Patent: Jun. 17, 2008

(54) POWER MODULE MEMBER MANUFACTURED BY WET TREATMENT, AND WET TREATMENT METHOD AND WET TREATMENT EQUIPMENT THEREOF

(75) Inventors: Ken Iyoda, Tokyo (JP); Makoto Namioka, Tokyo (JP); Hideyo Osanai, Tokyo (JP); Susumu Shimada, Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 14 days.

(21) Appl. No.: 10/397,429

(22) Filed: Mar. 27, 2003

(65) Prior Publication Data

US 2003/0213773 A1    Nov. 20, 2003

(30) Foreign Application Priority Data

Mar. 29, 2002   (JP)  ............................. 2002-096302
Nov. 19, 2002   (JP)  ............................. 2002-335638

(51) Int. Cl.
   *B44C 1/22*    (2006.01)
   *C03C 15/00*   (2006.01)
   *C03C 25/68*   (2006.01)
   *C23F 1/00*    (2006.01)

(52) U.S. Cl. .............................. 216/45; 216/41; 216/92

(58) Field of Classification Search .................. 216/13, 216/14, 41, 45, 46, 92; 438/734, 942, 943; 29/825, 827, 830, 831, 846; 156/345.19, 156/345.3, 345.11, 345.21
See application file for complete search history.

(56) References Cited

U.S. PATENT DOCUMENTS 3,323,967 A *  6/1967 Webb .................... 156/345.19
3,929,551 A * 12/1975 Frantzen ................ 156/345.19
4,611,745 A    9/1986 Nakahashi et al.
6,110,815 A    8/2000 Chia et al.

(Continued)

FOREIGN PATENT DOCUMENTS

JP     A 63-65653    3/1988

(Continued)

*Primary Examiner*—Roberts Culbert
(74) *Attorney, Agent, or Firm*—Oliff & Berridge, PLC

(57) ABSTRACT

The present invention provides a method of forming a circuit pattern on an integrally bonded member, the method not requiring a correction step of a laminate film or a resist film which has been necessary at the time of wet treatment of the integrally bonded member. After a circuit pattern forming metal plate 13 is bonded on a part of a ceramic substrate 12 so as to expose an outer peripheral edge portion of the ceramic substrate 12 in an integrally bonded member 10, the integrally bonded member 10 is set on a treating apparatus 30 while being covered with a masking member 20 having a window portion 22 from which the circuit pattern forming metal plate 13 of the integrally bonded member 10 is exposed. Further, the integrally bonded member 10 is pressed with an appropriate pressure from a base plate 11 side so that a boundary surface between a portion 23 surrounding the window portion in the masking member and an exposed surface 16 of the ceramic substrate which is exposed in a metal-ceramic bonded member 14 has a state not allowing a liquid to pass therethrough. Thereafter, a treatment solution 33 for wet treatment is injected from an injection pipe 35 to be in contact with the circuit pattern forming metal plate 13.

16 Claims, 10 Drawing Sheets

U.S. PATENT DOCUMENTS 6,296,753 B1　10/2001　Kaufman et al.

FOREIGN PATENT DOCUMENTS

| JP | A 6-136592 | 5/1994 |
|---|---|---|
| JP | A 06-334286 | 12/1994 |
| JP | A 7-22425 | 1/1995 |
| JP | A 11-124699 | 5/1999 |
| JP | A 2001-303297 | 10/2001 |

* cited by examiner

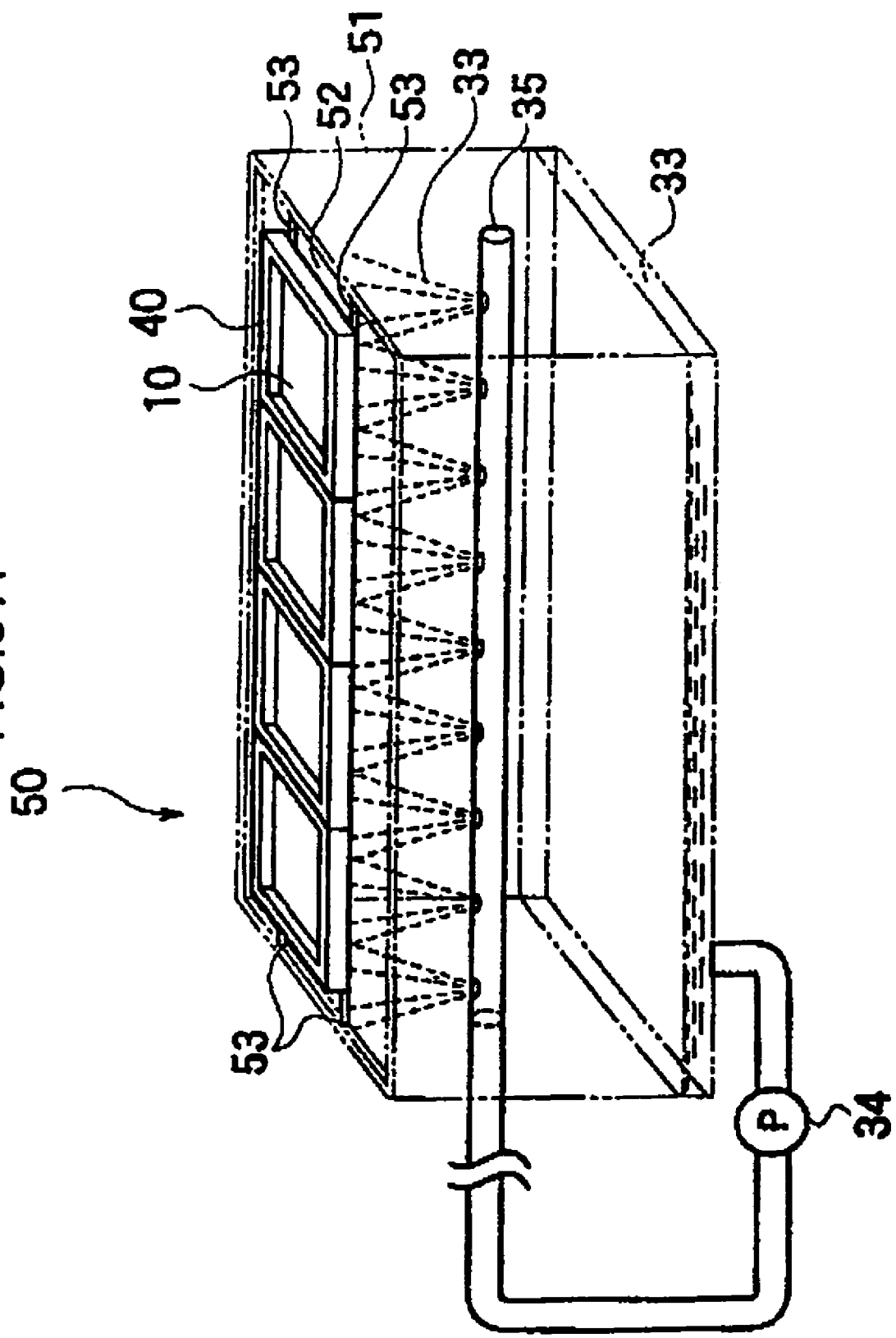

POWER MODULE MEMBER MANUFACTURED BY WET TREATMENT, AND WET TREATMENT METHOD AND WET TREATMENT EQUIPMENT THEREOF

1. FIELD OF INVENTION

The present invention relates to a method of forming a circuit pattern on a metal-ceramic bonded member constituted of a circuit pattern forming metal plate and a ceramic substrate which are bonded on each other, and further on a metal-ceramic bonded member of a base integral type in which a surface of the ceramic substrate opposite a surface having the circuit pattern forming metal bonded thereon is bonded on a base member (hereinafter, described as an integrally bonded member), a masking member, a wet treatment equipment for forming the circuit pattern, and so on.

2. DESCRIPTION OF THE RELATED ART

As a method of forming circuit patterns on conductive metal films provided on various kinds of substrates, a wet treatment method such as an etching process or plating is in wide use.

In this wet treatment method for the metal film, laminate coating is applied to portions not requiring the treatment, or a resist film or the like is provided on these portions by screen printing in advance so as to prevent a treatment solution such as an etching solution or a plating solution from coming into contact with the metal film (for example, refer to a patent document 1).

Japanese Patent Laid-open No. Sho 63-65653 (page 3)

In order to respond to a demand for passing a large amount of current through a circuit pattern provided on a substrate, a metal-ceramic bonded member in which a circuit pattern forming metal plate is bonded on a ceramic substrate, a base integrally bonded member in which a surface of the ceramic substrate opposite a surface having the circuit pattern forming metal plate bonded thereon is bonded on a base member, and the like have been developed. However, it has been found out that the following problems exist when the circuit pattern is formed on the circuit pattern forming metal plate of the integrally bonded member by a conventional method and a conventional circuit pattern treating apparatus is used.

The base member, which is bonded on the integrally bonded member as described above, is required to have thermal conduction and mechanical strength, and therefore, metal such as aluminum and copper, and a composite material of these metals and ceramic are suitably used. In order to prevent this base member from undergoing undesired wet treatment due to its contact with the treatment solution used for the wet treatment method, the wet treatment is performed in such a manner that laminate coating or resist coating is applied all over the integrally bonded member in advance, and an immersion method in the treatment solution, a showering method of the treatment solution, or the like is carried out after a laminate film or a resist film only on portions to be subjected to the wet treatment is removed.

However, in the integrally bonded member, both of the circuit pattern forming metal plate and the ceramic substrate constituting the integrally bonded member have a considerable thickness (for example, about 300 μm to about 500 μm for the circuit pattern forming metal plate and about 200 μm to about 800 μm for the ceramic substrate). Because of this, when the laminate coating or the resist coating is applied all over the integrally bonded member, the laminate film or the resist film cannot follow a level difference in rising portions or the like from the base member to the ceramic substrate, though having no problem on flat portions, so that gaps are sometimes caused between the integrally bonded member and the laminate film or the resist film.

When the laminate film or the resist film applied on the integrally bonded member is removed according to a desired circuit pattern in the state of having the gaps and the wet treatment is further applied, the treatment solution passes from portions where the laminate film or the resist film is removed to the gaps to enter the base member so that the base member may possibly be subjected to undesired treatment. Moreover, it is difficult to provide the resist film on side surfaces of the base member by an ordinary forming method which uses laminate coating or screen printing.

Especially when the aforesaid treatment is an etching process, the etching solution used therein is required to efficiently etch the circuit pattern forming metal plate which is far thicker than an ordinary metal film for a print circuit substrate. Hence, the etching solution is prescribed using a chemical having an extremely high etching capability, but it is concerned that this may frequently cause undesirable etching process to be applied to the base member.

Here, in order to avoid such a problem, a so-called correction step can be considered, the correction step being such that an operator applies a resist again using a brush or the like to portions which may possibly have gaps, after the laminate coating or the resist coating is applied all over the integrally bonded member. However, the execution of the correction step hinders productivity improvement of the wet treatment step of the integrally bonded member, and turns out to be a main cause of production cost increase of the integrally bonded member, FIG. 7 is a perspective view when a circuit pattern is to be formed by an etching process on an integrally bonded member 110 according to the conventional art to which the aforesaid laminate coating or the resist coating is applied (hereinafter, described as an integrally bonded member according to the conventional art), using a treating apparatus 130 according to the conventional art. In the treating apparatus 130 according to the conventional art, an etching solution injection pipe 135, a conveyer 150 composed of shafts 151 and wheels 152 are provided in a treatment tank 131.

The integrally bonded member 110 according to the conventional art is transferred on the conveyer 150 by the rotation of the wheels 152, with a circuit pattern forming metal plate thereof facing downward, and at this time, it receives an injection of an etching solution 133 from the injection pipe 135 provided under the conveyor 150 so that the circuit pattern forming metal plate is etched. The etching solution 133 injected to the inside of the treatment tank 131 is pooled in a bottom portion thereof to be pressure-sent to the injection pipe 135 by a pump 134.

However, when the circuit pattern forming metal plate of the integrally bonded member 110 according to the conventional art is etched through the use of the conventional treating apparatus 130, most of the etching solution 133 injected from the injection pipe 135 reaches the integrally bonded member 110 according to the conventional art after hitting the shafts 151 or the wheels 152. This lowers etching efficiency since a kinetic energy of the etching solution 133 is not usable for etching the circuit pattern forming metal plate. Further, due to need for a large number of the shafts 151 for holding the integrally bonded member according to the conventional art, the structure of the wet treatment equipment is made complicated, which forces the scale of the facility to be large in order to prevent leakage of the etching solution.

SUMMARY OF THE INVENTION

Such being the situation, it is an object of the present invention to provide a wet treatment method of an integrally bonded member not requiring a correction step, a wet treatment equipment with a high etching efficiency, and a masking member used for wet treatment; and further a power module member and the like which are manufactured from a metal-ceramic bonded member and the integrally bonded member using the wet treatment method and so on.

A first means for achieving the above-described object is a wet treatment method of a metal-ceramic bonded member constituted of a ceramic substrate and a circuit pattern forming metal plate bonded on the ceramic substrate, the method comprising:

having a masking member cover the metal-ceramic bonded member in which the circuit-pattern forming metal plate is bonded so as to expose an outer peripheral edge portion of the ceramic substrate, the masking member having a window portion from which the circuit pattern forming metal plate is exposed;

pressing the masking member against an exposed surface of the ceramic substrate so as to prevent a treatment solution for the wet treatment from passing through a portion where the masking member and the exposed outer peripheral edge portion of the ceramic substrate are in contact with each other; and during pressing the masking member, bringing the treatment solution for the wet treatment of the circuit pattern forming metal plate into contact with the circuit pattern forming metal plate.

The first means disables the treatment solution from passing through the portion where the masking member and the exposed outer peripheral edge portion of the ceramic substrate are in contact with each other at the time when the wet treatment using the treatment solution is applied to the metal-ceramic bonded member covered with the masking member, and consequently, the contact of the treatment solution with the base member can be avoided to eliminate the necessity of resist coating or film laminating all over the metal-ceramic bonded member, thereby eliminating the necessity of a correction step.

A second means is a wet treatment method of a metal-ceramic bonded member of a base integral type which is so structured that a metal-ceramic bonded member is bonded on a base member, the metal-ceramic bonded member being constituted of a ceramic substrate and a circuit pattern forming metal plate bonded on the ceramic substrate, the method comprising:

having a masking member cover the metal-ceramic bonded member of the base integral type in which the base member is bonded on the ceramic substrate so as to be exposed in a portion surrounding the ceramic substrate, the masking member having a window portion from which the ceramic substrate is exposed;

pressing the masking member against the exposed base member so as to prevent a treatment solution for the wet treatment from passing through a portion where the masking member and the base member exposed in the portion surrounding the ceramic substrate are in contact with each other; and during pressing the masking member, bringing the treatment solution for the wet treatment of the circuit pattern forming metal plate into contact with the circuit pattern forming metal plate.

In the above-described structure, the treatment solution does not come in contact with the circuit pattern forming metal plate even when the treatment solution stays in a portion where the masking member and an exposed peripheral edge portion of the ceramic substrate are in contact with each other, at the time when the wet treatment using the treatment solution is applied to the metal-ceramic bonded member of the base integral type covered with the masking member. Consequently, the wet treatment of the circuit pattern forming metal plate can be stably and uniformly performed. Further, since the treatment solution is unable to pass through the portion where the masking member and the base member are in contact with each other, the contact of the treatment solution with the base member can be practically avoided so that resist coating or film laminating over the whole metal-ceramic bonded member of the base integral type is not required to eliminate the necessity of a correction step.

A third means is a wet treatment method of a metal ceramic bonded member of a base integral type according to the second means, in which the base member has a plate shape or a fin structure.

The wet treatment method of the metal-ceramic bonded member of the base integral type according to the second means is also suitably applicable when the base member is a base plate having a plate shape or has the fin structure.

A fourth means is a wet treatment method of a metal-ceramic bonded member and a metal-ceramic bonded member of a base integral type according to any one of the first to third means, in which the treatment solution is an etching solution for the circuit pattern forming metal plate, and the circuit pattern forming metal plate of the metal-ceramic bonded member is covered with the masking member having the window portion from which the circuit pattern forming metal plate is exposed, after a protection pattern having a resistance to the etching solution is formed on a desired portion, The etching solution for the circuit pattern forming metal plate is used as the treatment solution, and the protection pattern having a resistance to the etching solution is formed in advance on the desired portion of the circuit pattern forming metal plate so that the circuit pattern forming metal plate can be etched into a desired circuit pattern.

A fifth means is a wet treatment method of a metal-ceramic bonded member and a metal-ceramic bonded member of a base integral type according to any one of the first to third means, in which the treatment solution is a plating solution for the circuit pattern forming metal plate.

The plating solution for the circuit pattern forming metal plate is used as the treatment solution so that desired plating can be applied to the circuit pattern forming metal plate.

A sixth means is a wet treatment method of a metal-ceramic bonded member and a metal-ceramic bonded member of a base integral type according to any one of the first to third means, in which the treatment solution is a plating solution for the circuit pattern forming metal plate, and the circuit pattern forming metal plate of the metal-ceramic bonded member is covered with the masking member having the window portion from which the circuit pattern forming metal plate is exposed, after a protection pattern preventing plating with the plating solution is formed on a desired portion.

The plating solution for the circuit pattern forming metal plate is used as the treatment solution, and the protection pattern preventing the plating with the plating solution is formed in advance on the desired place of the circuit pattern forming metal plate so that desired plating can be applied to a desired portion in the circuit pattern forming metal plate.

A seventh means is a wet treatment method of a metal-ceramic bonded member and a metal-ceramic bonded member of a base integral type according to any one of the fourth to sixth means, in which an appropriate resist is applied to or an appropriate film is bonded on the circuit pattern forming metal plate to form the protection pattern.

In the above-described structure, since the treatment solution is unable to pass through the portion where the masking member and the exposed outer peripheral edge portion of the ceramic substrate are in contact with each other, the appropriate resist or the like only needs to be applied to or laminated on a portion where the formation of the protection pattern is desired. Consequently, a highly productive and low-cost printing method is applicable as, for example, a resist coating method.

An eighth means is a masking member which is used for a wet treatment method of a metal-ceramic bonded member of a base integral type so structured that a metal-ceramic bonded member is bonded on a base member, the metal-ceramic bonded member being constituted of a ceramic substrate and a circuit pattern forming metal plate bonded on the ceramic substrate, and which has a window portion from which the circuit pattern forming metal plate is exposed, a portion surrounding the window portion being pressed against the ceramic substrate or the base member.

Wet treatment using a treatment solution is applied to the circuit pattern forming metal plate while the metal-ceramic bonded member of the base integral type is covered with the masking member as structured above, so that resist coating or film laminating all over the metal-ceramic bonded member of the base integral type becomes unnecessary to eliminate the necessity of a correction step.

A ninth means is a masking member according to the eighth means, comprising:

a base having the window portion; a pressing portion having the window portion and deformable by a pressing force; and a plurality of elastic members, in which the pressing portion is disposed on the base via the plural elastic members, the metal-ceramic bonded member of the base integral type is disposed on the pressing portion, and the metal-ceramic bonded member of the base integral type is pressed against the pressing portion.

Even when the base member of the metal-ceramic bonded member of the base integral type which is to be masked has undulation, the pressing portion of the masking member structured above is pressed against the base member to deform along the undulation, so that the masking member can prevent the infiltration of the treatment solution into a masked portion of the metal-ceramic bonded member of the base integral type.

A tenth means is a wet treatment equipment having a tank which feeds a treatment solution to a metal plate bonded on a substrate to perform wet treatment of the metal plate, the wet treatment equipment comprising:

a treatment solution feeding portion, which is provided in the tank, to feed the treatment solution to the metal plate;

a substrate setting portion, which is provided on an upper surface or a side surface of the tank, to set the substrate thereon; and an opening portion of the tank to expose to an inner part of the tank the metal plate bonded on the substrate which is set on the substrate setting portion.

Since the wet treatment equipment as structured above is able to directly feed the treatment solution to the substrate which is set on the upper surface or the side surface of the tank, an effective use of the treatment solution fed from the treatment solution feeding portion is possible, and since the metal-ceramic bonded member of the base integral type can be stably supported on the treatment tank, stable and uniform wet treatment of the circuit pattern forming metal plate is possible.

An eleventh means is a wet treatment equipment according to the tenth means, in which the opening portion of the tank is provided with a guide member to movably set the substrate on the opening portion.

The wet treatment equipment as structured above can perform the wet treatment of the substrate successively to achieve a high productivity of the wet treatment step.

A twelfth means is a wet treatment equipment according to the tenth or the eleventh means, in which the substrate with the masking member attached thereto is subjected to the wet treatment.

The wet treatment equipment as structured above can apply the wet treatment to the substrate only by attaching the masking member thereto so that productivity of the wet treatment step can be enhanced.

A thirteenth means is a power module member, being manufactured from the metal-ceramic bonded member or the metal-ceramic bonded member of the base integral type by the wet treatment method according to any one of the first to seventh means.

A fourteenth means is a power module, being manufactured from the power module member according to the thirteenth means.

DETAILED DESCRIPTION OF THE PREFERRED EMBODIMENT(S)

Embodiment 1

Hereinafter, (Embodiment 1) according to the present invention will be explained with reference to FIG. 1 to FIG. 4.

Figure 1:
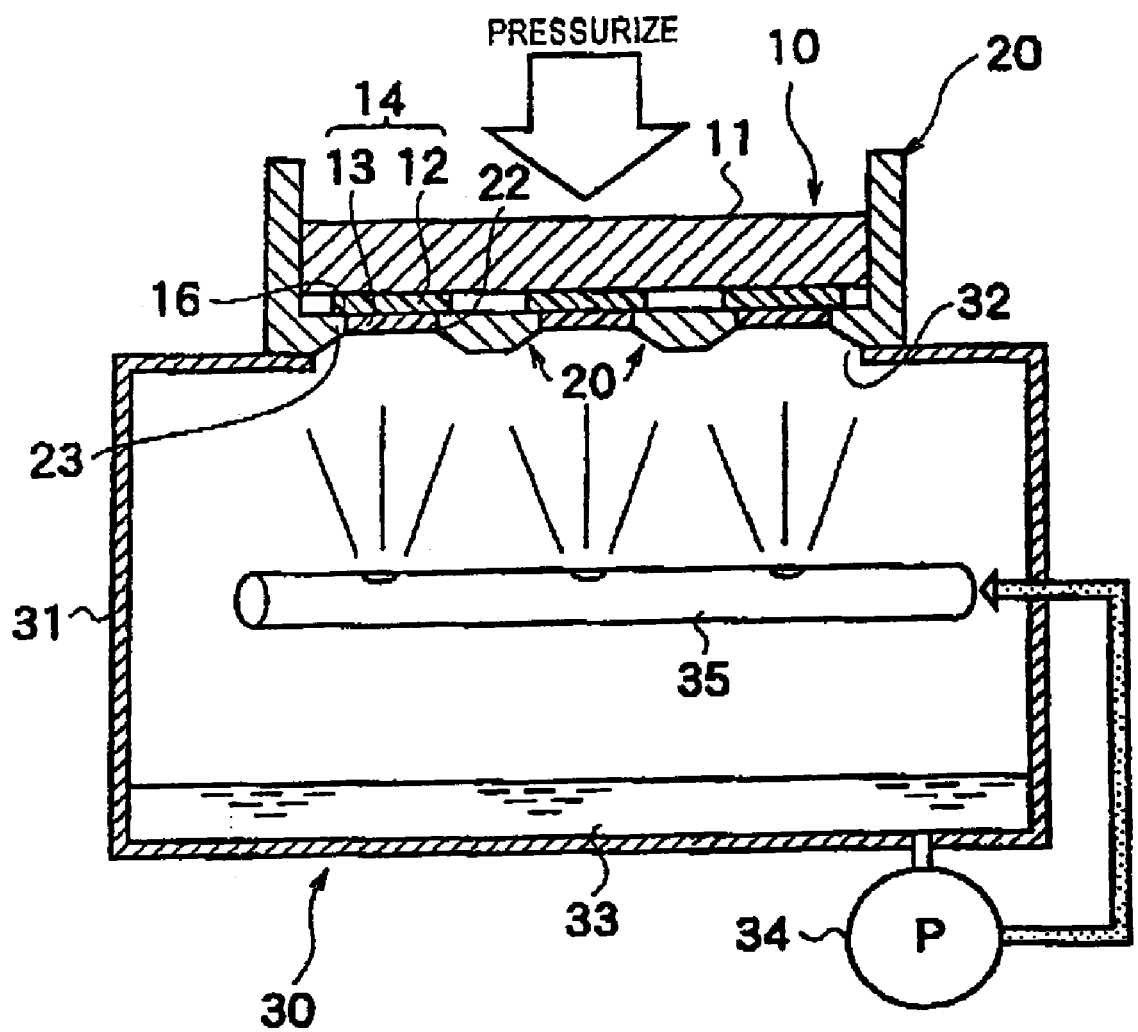
FIG. 1 is a schematic cross sectional view of wet treatment of an integrally bonded member according to an embodiment.
Figure 2:
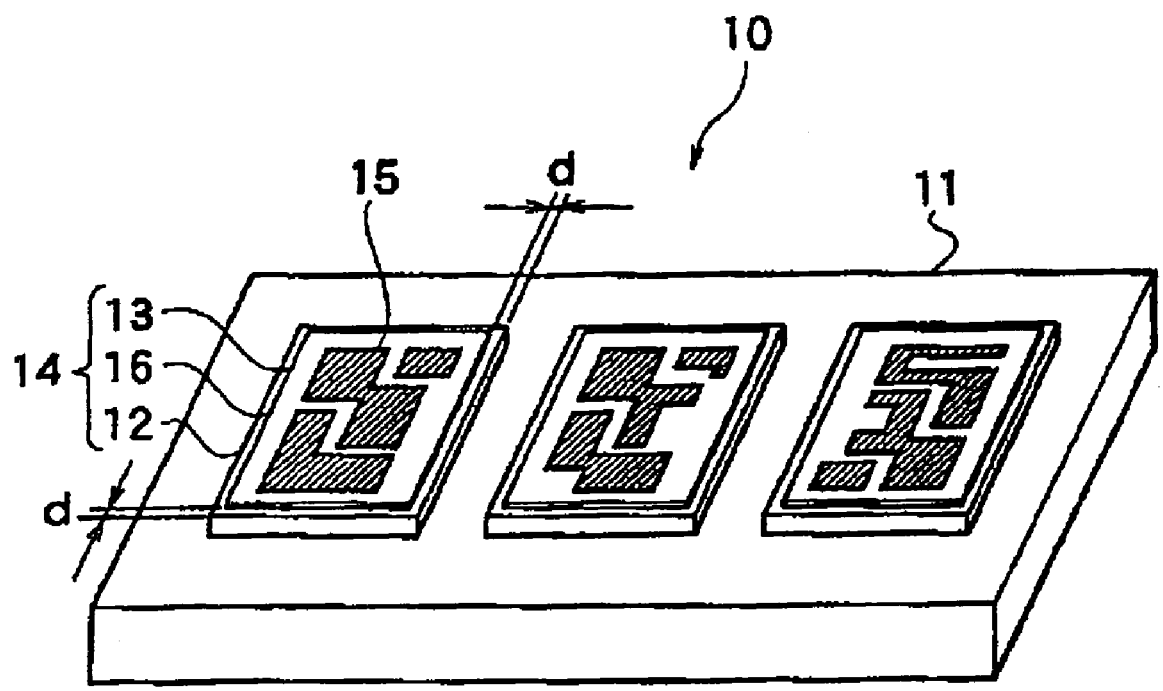
FIG. 2 is a perspective view of the integrally bonded member according to the embodiment.
Figure 3:
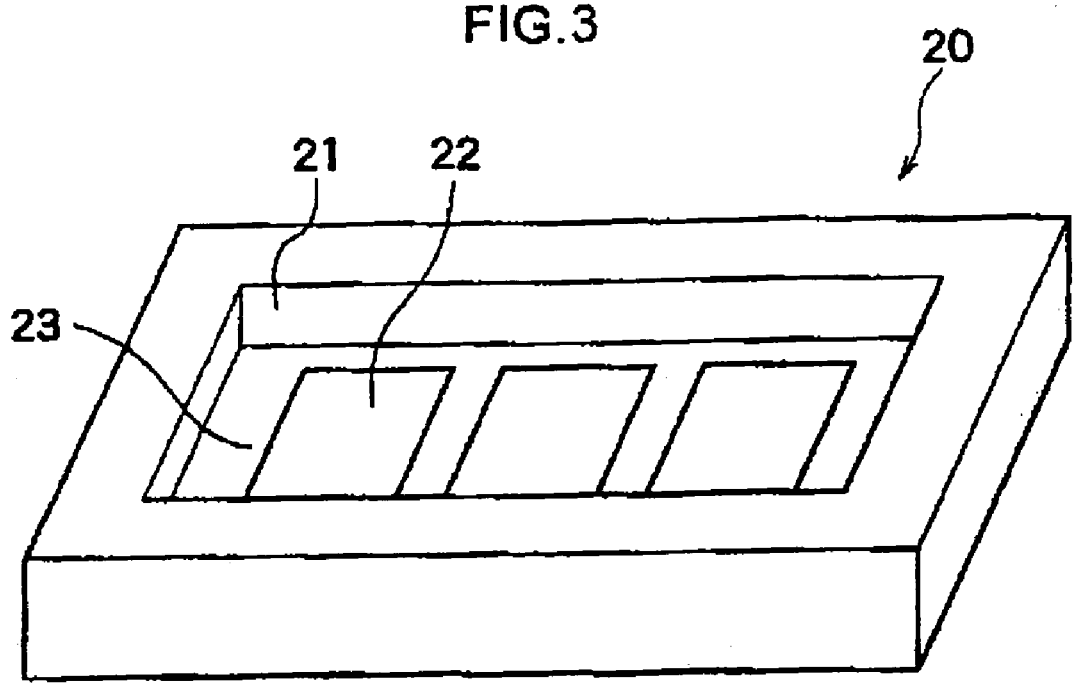
FIG. 3 is a perspective view of a masking member according to the embodiment.
Figure 4:
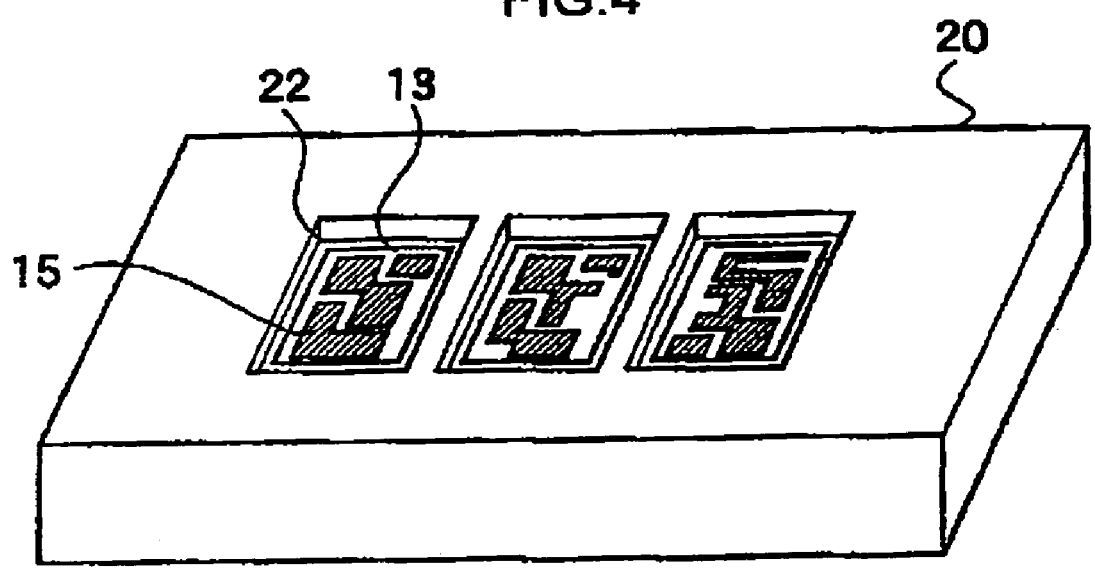
FIG. 4 is a perspective view when the integrally bonded member is covered with the masking member according to the embodiment.

FIG. 1 is a schematic cross sectional view when desired wet treatment is applied to an integrally bonded member covered with a masking member according to this embodiment, FIG. 2 is a perspective view of the integrally bonded member according to this embodiment, FIG. 3 is a perspective view of the masking member having a substantially equal shape to a square measuring box according to this embodiment, seen from a recessed portion side of the substantially equal shape to the square measuring box, and FIG. 4 is a perspective view of the masking member having the substantially equal shape to the square measuring box according to this embodiment, seen from a window portion side of the masking member when the masking member covers the integrally bonded member.

First, in FIG. 2, an integrally bonded member 10 is so structured that a desired number (an example of three is shown in FIG. 2) of metal-ceramic bonded members 14 each constituted of a ceramic substrate 12 and a circuit pattern forming metal plate 13 bonded on each other are provided on a base plate 11 which is a base member including metal or a composite material of metal, ceramic, and so on, and a ceramic substrate side opposite the circuit pattern forming metal plate 13 of each of the metal-ceramic bonded members 14 is bonded on the base plate 11.

In the metal-ceramic bonded member 14, the circuit pattern forming metal plate 13 is bonded on a part of the ceramic substrate 12 so as to expose an outer peripheral edge portion of the ceramic substrate 12, the exposed outer peripheral edge portion having a width d (d=about 0.5 mm to about 1.5 mm).

An exposed surface 16 of the outer peripheral edge portion in this ceramic substrate 12 comes in contact with a masking member, which will be described later, thereby preventing the passage of a treatment solution for wet treatment which tries to pass through this portion and ensuring withstand voltage of an electronic circuit to be formed on the circuit pattern forming metal plate 13 and the base plate 11.

On the circuit pattern forming metal plate 13, a protection pattern 15 patterned after, for example, a desired circuit pattern is provided.

Metal having a high thermal conduction and high mechanical strength such as aluminum and copper, and a composite material of these metals and ceramic are suitably used as the base plate 11. Aluminum nitride or the like having a high electrical resistance and a high thermal conduction is suitably used as the ceramic substrate 12. Metal having a high electrical conduction such as aluminum and copper, and an alloy of these metals are suitably used as the circuit pattern forming metal plate 13.

Next, in FIG. 3, the masking member 20 has a recessed portion 21 provided in a center portion thereof, and window portions 22 provided in a bottom surface of the recessed portion 22. This recessed portion 21 has a size allowing the integrally bonded member 10 to be just fitted therein, and entire surfaces of the circuit pattern forming metal plates 13 face the window portions 22 when the masking member 20 covers the integrally bonded member 10. The window portions 22 are so positioned that the exposed surfaces 16 of the outer peripheral edge portions in the ceramic substrates 12 come in contact with a portion 23 surrounding the window portions 22 in the masking member 20 to prevent the passage of the treatment solution by this portion.

Incidentally, a material of the masking member 20 has to be a material such as rubber, plastic, or metal having a high chemical resistance to the etching solution, the plating solution, and the like, and for example, silicon rubber, fluorine rubber, polypropylene, Teflon, and so on can be suitably used.

Here, as shown in FIG. 4, the circuit pattern forming metal plates 13 are exposed from bottom portions of the window portions 22 provided in the masking member 20. The protection pattern 15 of a resist or the like having resistance to, for example, the etching solution is provided on each of the circuit pattern forming metal plates 13.

As shown in FIG. 1, in wet treatment according to this embodiment, the integrally bonded member 10 covered with the masking member 20 is set on an opening portion 32 provided in an upper portion of a treatment tank 31 in a treating apparatus 30 for wet treatment.

The integrally bonded member 10 is so structured, as described above, that the circuit pattern forming metal plate 13 is bonded on a part of the ceramic substrate 12 so as to expose the outer peripheral edge portion of the ceramic substrate 12 to constitute the metal-ceramic bonded member 14, and the ceramic substrate 12 side of each of one or two or more metal ceramic bonded member(s) 14 is bonded on the base plate 11.

The masking member 20 having the window portions 22 from which the circuit pattern forming metal plates 13 are exposed covers this integrally bonded member 10 so that the portion 23 surrounding the window portions in the masking member 10 comes in contact with the exposed surfaces 16 of the outer peripheral edge portions in the ceramic substrates 12 exposed in the metal-ceramic bonded members 14.

Then, the integrally bonded member 10 covered with the masking member 20 is set on the opening portion 32 provided in the upper portion of the treatment tank 31 in the treating apparatus 30 with a circuit pattern forming metal plate 13 side thereof facing downward.

A treatment solution 33, which is pooled in a bottom portion of the treatment tank 31, is pressure-sent to an injection pipe 35 by a pump 34 to be injected upward from the injection pipe 35 and after coming into contact with the circuit pattern forming metal plates 13 to apply desired wet treatment thereto, it drops down to the bottom portion of the treatment tank 31. This injection pipe 35 may be fixed in the treatment tank 31, but such a structure is preferable that the injection pipe 35 is provided with a function allowing it to rock in a horizontal direction, a vertical direction, and so on since this structure can bring the treatment solution 33 into contact with the circuit pattern forming metal plates 13 uniformly from various directions so that uniform etching without any variation depending on places can be achieved.

Next, an etching process as an example of a wet treatment method for the integrally bonded member will be explained, referring again to FIG. 1, FIG. 2, and FIG. 4.

First, the metal-ceramic bonded member 14 shown in FIG. 2 is made by bonding the circuit pattern forming metal plate 13 on the ceramic substrate 12. At this time, the circuit pattern forming metal plate 13 is bonded so as to expose the outer peripheral edge portion of the ceramic substrate 12, the exposed outer peripheral edge portion having the width d (d=about 0.5 mm to about 1.5 mm), as described above.

A desired number of thus formed metal-ceramic bonded members 14 each having the exposed surface 16 are prepared, and the ceramic substrate 12 sides thereof are bonded on the base plate 11.

Incidentally, depending on cases, the bonding of the ceramic substrate 12 and the circuit pattern forming metal plate 13 and the bonding of the ceramic substrate 12 and the base plate 11 are performed concurrently.

The circuit pattern forming metal plate 13 of each of the metal-ceramic bonded members 14 bonded on the base plate 11 is coated with the protection pattern 15 of a resist or the like patterned after a predetermined shape. Various methods are applicable as this coating method, but in the present invention, since the circuit pattern forming metal plate 13 is not completely coated with a laminate or a resist in advance, a highly productive and low-cost printing method can be suitably applied in the case of, for example, resist coating.

In this manner, the integrally bonded member 10 having a desired number of the metal-ceramic bonded members 14 which have been subjected to the resist coating is obtainable.

Incidentally, in a case when plating or the like is applied to the entire surfaces of the circuit pattern forming metal plates 13 in wet treatment described later, the above-mentioned resist coating or the like on the circuit pattern forming metal plate 13 is not necessary.

As shown in FIG. 4, when the obtained integrally bonded member 10 is covered with the masking member 20, portions corresponding to the circuit pattern forming metal plates 14 of the integrally bonded member 10 are exposed from the window portions 22 of the masking member 20. At this time, the aforesaid exposed surfaces 16 of the outer peripheral edge portions in the ceramic substrates 12 come in contact with the portion 23 surrounding the window portions 22 in the masking member 20.

Next, as shown in FIG. 1, the integrally bonded member 10 covered with the masking member 20 is set on the opening portion 32 provided in the upper portion of the treatment tank 31 in the treating apparatus 30, with the circuit pattern forming metal plate 13 thereof facing downward.

Incidentally, the direction of setting the integrally bonded member 10 relative to the treatment tank 31 may be a horizontal direction, an oblique direction, and so on as desired as long as the treatment solution does not stay in the window portions 22 of the masking member 20, as will be described later.

Further, during this wet treatment, the integrally bonded member 10 is preferably pressed with an appropriate pressure from the base plate 11 side. This is because this pressurization increases adhesiveness of the aforesaid portions where the exposed surfaces 16 of the ceramic substrates 12 and the portion 23 surrounding the window portions 22 in the masking member 20 are in contact with each other, and adhesiveness of portions where the masking member 20 and the treatment tank 31 are in contact with each other, thereby producing a state preventing the passage of a liquid.

The pressing force may be appropriately determined, but it is generally suitable to give a pressing force of about 0.05 kg/cm$^2$ to about 0.3 kg/cm$^2$ to the portions where the masking member 20 and the treatment tank 31 are in contact with each other.

When the setting of the integrally bonded member 10 on the treating apparatus 30 has been finished, the treatment solution (etching solution) 33 pooled in the bottom portion of the treatment tank 31 is pressure-sent to the injection pipe 35 by the pump 34 and injected upward from the injection pipe 35 to be in contact with the circuit pattern forming metal plates 13, thereby carrying out an etching process. At this time, if the injection pipe 35 has a rocking mechanism, the injection pipe 35 is preferably rocked. The treatment solution (etching solution) 33 which has etched metal portions drops to a lower part of the treatment tank 31 to be pooled in the bottom portion.

The adoption of this structure enables continuous feed of uniform and fresh treatment solution (etching solution) 33 to the surfaces of the circuit pattern forming metal plates 13, and at the same time, makes it possible to obtain an effect of preventing the treatment solution (etching solution) 33 from staying on boundary surfaces between the circuit pattern forming metal plates 13 and the window portions 22 of the masking member 20.

This structure firstly aims at increasing etching efficiency since the thickness of the circuit pattern forming metal plates 13 is far larger than that of a metal foil used for an ordinary printed substrate.

It secondly aims at avoiding as much as possible such a situation that the treatment solution (etching solution) 33 etches undesired portions of the circuit pattern forming metal plates 13 as well due to its high corrosion behavior which is intended for efficient etching of the circuit pattern forming metal plates 13 far thicker than a metal film provided on a conventional substrate as described above.

However, even when the aforesaid structure is adopted, the treatment solution (etching solution) 33 may possibly pass through and enter from the boundary surfaces between the circuit pattern forming metal plates 13 and the window portions 22.

Here, in the present invention, the portions where the portion 23 surrounding the window portions 22 in the masking member 20 and the exposed surfaces 16 are in contact with each other have sufficient adhesiveness to prevent the passage of a liquid through these portions as described above, and in addition, even when the treatment solution (etching solution) 33 enters, since neither the ceramic substrates 12 nor the masking member 20 is corroded by the treatment solution (etching solution) 33, the further passage thereof can be prevented by these portions.

As a result, the corrosion of the base plate 11 by the treatment solution (etching solution) 33 is avoidable.

When the etching process by the wet treatment is completed in this manner and the circuit pattern forming metal plates are turned into predetermined circuit patterns, the injection of the treatment solution (etching solution) 33 is stopped, and the boundary surfaces between the circuit pattern forming metal plates 13 and the window portions 22 of the masking member 20, and so on are cleaned, thereby forming a circuit.

Further, when plating is performed, a protection pattern 15 patterned after a predetermined plating pattern is provided on each of the circuit pattern forming metal plates 13 of the integrally bonded member 10, similarly to the above-described etching process. However, when the entire surfaces of the circuit pattern forming metal plates 13 require the plating, the protection patterns 15 are unnecessary.

The integrally bonded member 10 coated with the protection patterns 15 is covered with the masking member 20, set on the opening portion 32 provided in the upper portion of the treatment tank 31 in the treating apparatus 30, and pressed with an appropriate pressure from the base plate 11 side. This pressurization continues while the plating is performed, similarly to the etching process.

If this plating step is to be carried out by electroless plating processing, it can be carried out by using the treating apparatus 30 used in the above-described etching process and changing the treatment solution 33 from the etching solution to a series of treatment solutions for the electroless plating.

In this plating, the portions where the exposed surfaces 16 of the ceramic substrates 12 and the portion 23 surrounding the window portions 22 in the masking member 20 are in contact with each other also have sufficient adhesiveness and block the passage of the treatment solution (plating solution) 33 so that plating of the base plate 11 is avoidable.

When the etching process or the plating is completed in this manner, the integrally bonded member 10 can be sent to a subsequent step only by taking out the integrally bonded member 10 from the masking member 20.

Embodiment 2

Next, (Embodiment 2) which is another embodiment according to the present invention will be explained with reference to FIG. 5, FIG. 6A, and FIG. 6B.

Figure 5:
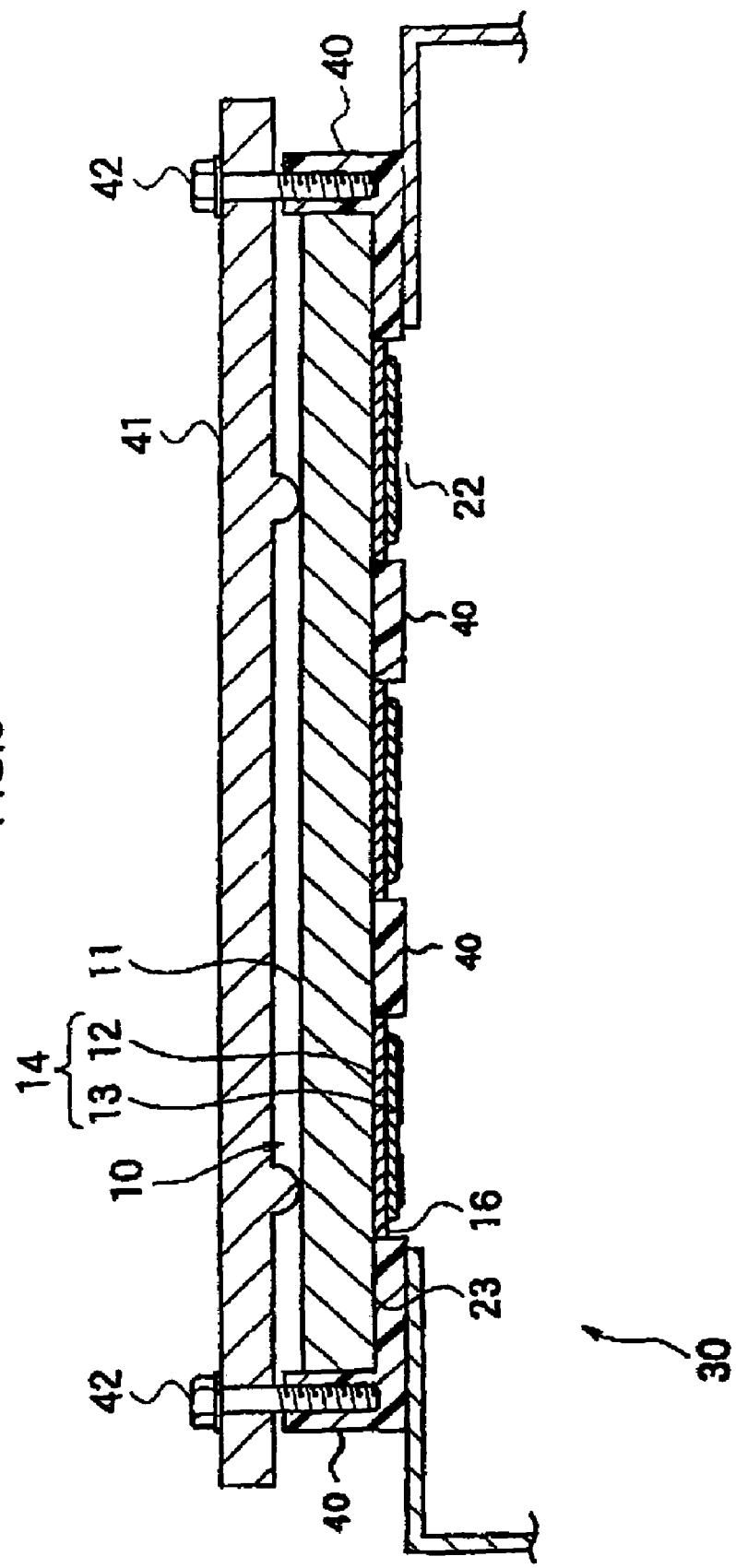
FIG. 5 is a cross sectional view when the integrally bonded member is covered with a masking member according to another embodiment.
Figure 6:
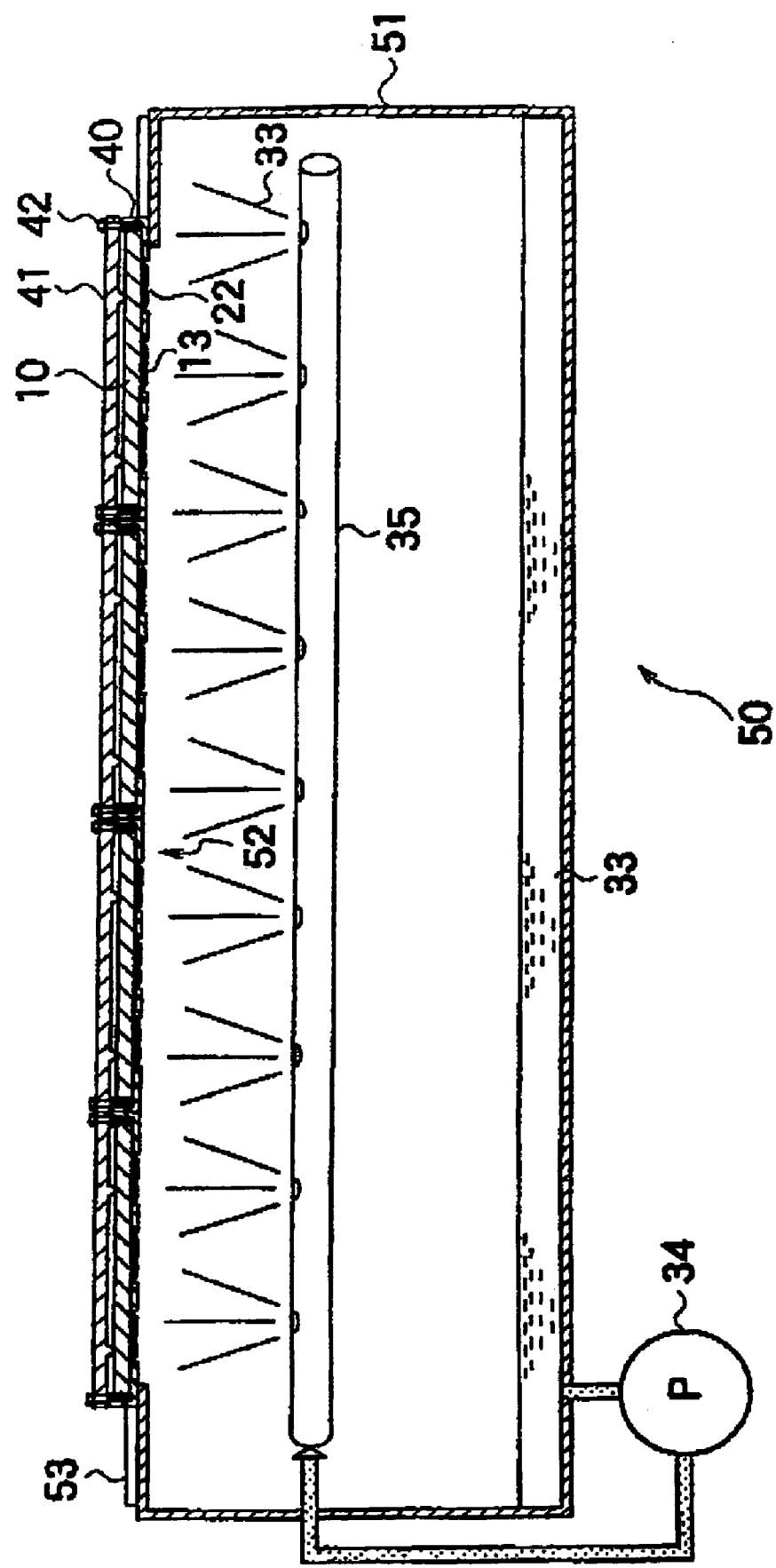
FIG. 6A is a schematic perspective view of wet treatment of the integrally bonded member according to the other embodiment.
FIG. 6B is a schematic cross sectional view of FIG. 6A.
Figure 7:
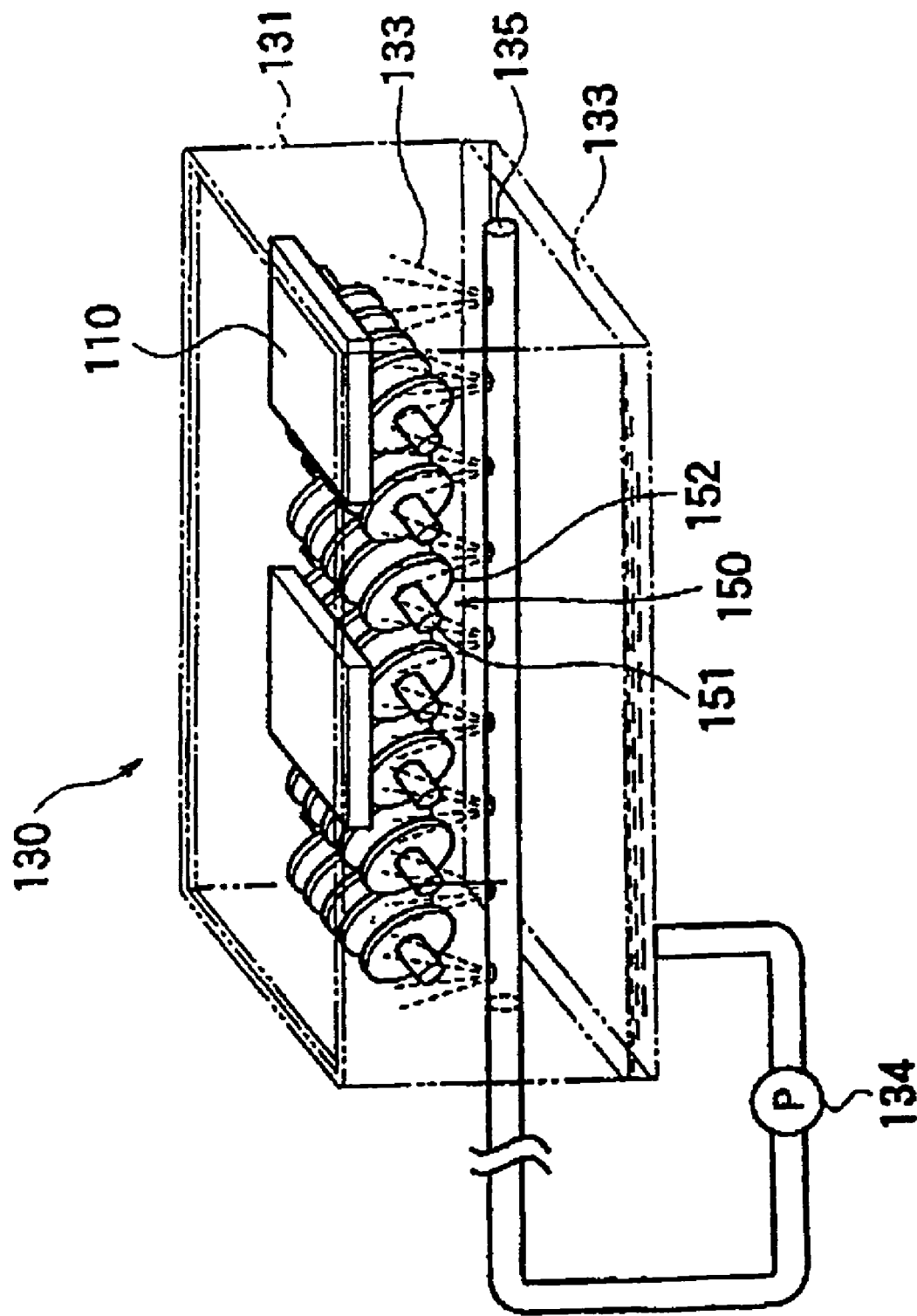
FIG. 7 is a schematic perspective view of wet treatment of an integrally bonded member according to a conventional art.

FIG. 5 is a cross sectional view when the integrally bonded member 10 explained in (Embodiment 1) is covered with a masking member according to another embodiment, FIG. 6A is a perspective view when wet treatment is applied to the integrally bonded member 10 covered with the aforesaid masking member in a treating apparatus for wet treatment according to this embodiment, and FIG. 6B is a cross sectional view of FIG. 6A.

First, in FIG. 5, a masking member 40 has a substantially equal shape to a square measuring box, similarly to the masking member 20 explained in (Embodiment 1), and it accommodates the integrally bonded member 10 having a predetermined number of the metal ceramic bonded members 14 bonded thereon. A circuit pattern forming metal plate 13 side of the integrally bonded member 10 accommodated in the masking member 40 is exposed to the inside of the treatment tank via window portions 22 of the masking member 40

Here, in this embodiment, the window portions 22 in the masking member 40 are so arranged that a portion 23 surrounding the window portions 22 is in close contact not with the outer peripheral edge portions of the ceramic substrates 12 of the integrally bonded member 10 but with the base plate 11, which corresponds to a base member surrounding the ceramic substrates 12. Further, in this embodiment, in order to press the integrally bonded member 10 with an appropriate force, a back board 41 is provided at the back of the base plate 11, the back board 41 and the masking member 40 are fastened with fastening tools 42, and these fastening tools 42 are fastened appropriately so that the integrally bonded member 10 is pressed against the masking member 40. As a result, the integrally bonded member 10 and the masking member 40 can be integrated while the integrally bonded member 10 is pressed against the masking member 40 with a desired force.

In this embodiment, the adoption of the above-described structure makes it possible to obtain, in addition to the effect explained in (Embodiment 1), an effect of preventing the treatment solution from staying on boundary surfaces between the circuit pattern forming metal plates 13 and the window portions 22 of the masking member 40. As a result, an etching speed can be further improved.

On the other hand, the possibility that the treatment solution enters from the boundary surfaces between the ceramic substrates 12 and the window portions 22 to etch the base plate 11 was concerned about in this embodiment. However, it has been found out that actually, an amount of the treatment solution entering from the boundary surfaces is only a little and insignificant when the integrally bonded member 10 is in ordinary use.

Incidentally, a material of the masking member 40 has to be a material such as rubber, plastic, or metal similarly to (Embodiment 1), and for example, silicon rubber, fluorine rubber, polypropylene, Teflon, and so on can be suitably used. As the fastening tool 42, a bolt or the like made of a noncorrosive material such as vinyl chloride, polypropylene, and Teflon can be suitably used.

Next, in FIG. 6A and FIG. 6B, a treating apparatus 50 for wet treatment according to this embodiment has an injection pipe 35 of a treatment solution 33 provided inside the treatment tank 51, an opening portion 52 provided on an upper surface thereof parallel to the injection pipe 35, and guide members 53 provided on both sides of this opening. One or a plurality of integrally bonded member(s) 10 described above, each covered with the masking member 40 and pressed against the masking member 40 by the back board 41 (not shown in FIG. 6A) and the fastening tools 42 (not shown in FIG. 6A), is (are) set on the opening portion 52 via the guide members 53 to be movable on the opening portion 52. The positional relation between the opening portion 52 and the injection pipe 35 and the arrangement of injection holes provided in the injection pipe 35 are so set that a sufficient amount of the treatment solution 33 is fed to the surfaces of the circuit pattern forming metal plates 13 (not shown in FIG. 6A) of the integrally bonded member 10 via the window portions 22 (not shown in FIG. 6A) of the masking member 40 which moves on the opening portion 52. The treatment solution 33 injected from the injection pipe 35 is finally pooled in a bottom portion of the treatment tank 51 to be pressure-sent to the injection pipe 35 by a pump 34.

Further, as explained also in (Embodiment 1), the injection pipe 35 may be fixed in the treatment tank 51, but such a structure is preferable that the injection pipe 35 is provided with a function allowing it to rock in a horizontal direction, a vertical direction, and so on since this structure can bring the treatment solution 33 into contact with the circuit pattern forming metal plates 13 uniformly from various directions so that uniform etching without any variation depending on places can be achieved.

Here, as the structure of the guide members 53, the combination of a protruding portion and a recessed portion, the combination of a rack and a pinion, the combination of a wheel and a rail, the combination dependent on a magnetic absorption, and so on can be considered, and from the viewpoint of leakage of the treatment solution 33 and the like, the combination of the protruding portion and the recessed portion is preferable.

Further, an opening of the opening portion 52 in the treating apparatus 50 is preferably provided on the upper surface of the treatment tank 51 in view of setting and the like of the integrally bonded members 10, but the opening portion 52 may be provided on a side surface of the treatment tank 51 as long as a sufficient amount of the treatment solution 33 is fed to the surfaces of the circuit pattern forming metal plates 13 of the integrally bonded member 10.

Next, an etching process will be explained, similarly to (Embodiment 1), as an example of a wet treatment method of the integrally bonded member according to this embodiment with reference to FIG. 5, FIG. 6A, and FIG. 6B.

First, the circuit pattern forming metal plate 13 is bonded on the ceramic substrate 12 to form the metal-ceramic bonded member 14, similarly to (Embodiment 1), but the width d of the outer peripheral edge portion of the ceramic substrate 12 need not be provided if so desired. A desired number of thus formed metal-ceramic bonded members 14 are prepared and the ceramic substrate 12 sides thereof are bonded on the base plate 11.

Incidentally, depending on cases, the bonding of the ceramic substrate 12 and the circuit pattern forming metal plate 13 and the bonding of the ceramic substrate 12 and the base plate 11 are performed concurrently.

A resist or the like patterned after a predetermined shape is applied to the circuit pattern forming metal plate 13 of each of the metal-ceramic bonded members 14 which are bonded on the base plate 11, similarly to (Embodiment 1), to form the protection pattern. As shown in FIG. 5, when the obtained integrally bonded member 10 is covered with the masking member 40, portions of the ceramic substrates 12 of the integrally bonded member 10 are exposed from the window portions 22 of the masking member 40. At this time, a portion of the base plate 11 surrounding the ceramic substrates 12 is in contact with a portion surrounding the window portions 22 in the masking member 40.

Next, the back board 41 is disposed at the back of the base plate 11, the back board 41 and the masking member 40 are fastened with the fastening tools 42, and the base plate 11 surrounding the ceramic substrates 12 of the integrally bonded member 10 is pressed against the portion 23 surrounding the window portions 22 in the masking member 40. The pressing force may be determined appropriately, but it is generally suitable that the pressing force of about 0.05 kg/cm$^2$ to about 0.3 kg/cm$^2$ is given to the portion where the masking member 40 and the treatment tank 51 are in contact with each other. Thus, the integrally bonded member 10 covered with the masking member 40 is made.

A desired number of the integrally bonded members 10 each covered with the masking member 40 are made, which are set successively on the opening portion 52 provided in the upper portion of the treatment tank 51 in the treating apparatus 50 shown in FIG. 6A and FIG. 6B, via the guide members 53, with the circuit pattern forming metal plates (not shown) thereof facing downward.

When the setting of the integrally bonded members 10 on the treating apparatus 50 has been finished, the treatment solution (etching solution) 33 pooled in the bottom portion of the treatment tank 51 is pressure-sent to the injection pipe 35 by the pump 34 and injected upward from the injection pipe 35 to come into contact with the circuit pattern forming metal plates 13, thereby performing the etching process. At this time, if the injection pipe 35 has a rocking mechanism, the injection pipe 35 is preferably rocked. Meanwhile, the integrally bonded members 10 on the treating apparatus 50 are subjected to the etching process for a predetermined time while being moved on the opening portion 52, and the etching process of the plural integrally bonded members 10 can be performed successively.

When the etching process by the wet treatment is thus completed, the integrally bonded members 10 each covered with the masking member 40 are removed from the guide members 53, the boundary surfaces between the circuit pattern forming metal plates 13 and the window portions 22 of the masking members 40, and so on are cleaned, and plating which is a subsequent step is applied to the circuit pattern forming metal plates 13 as desired, similarly to (Embodiment 1).

Embodiment 3

Next, (Embodiment 3) as still another embodiment according to the present invention will be explained with reference to FIG. 8 to FIG. 10.

Figure 8:
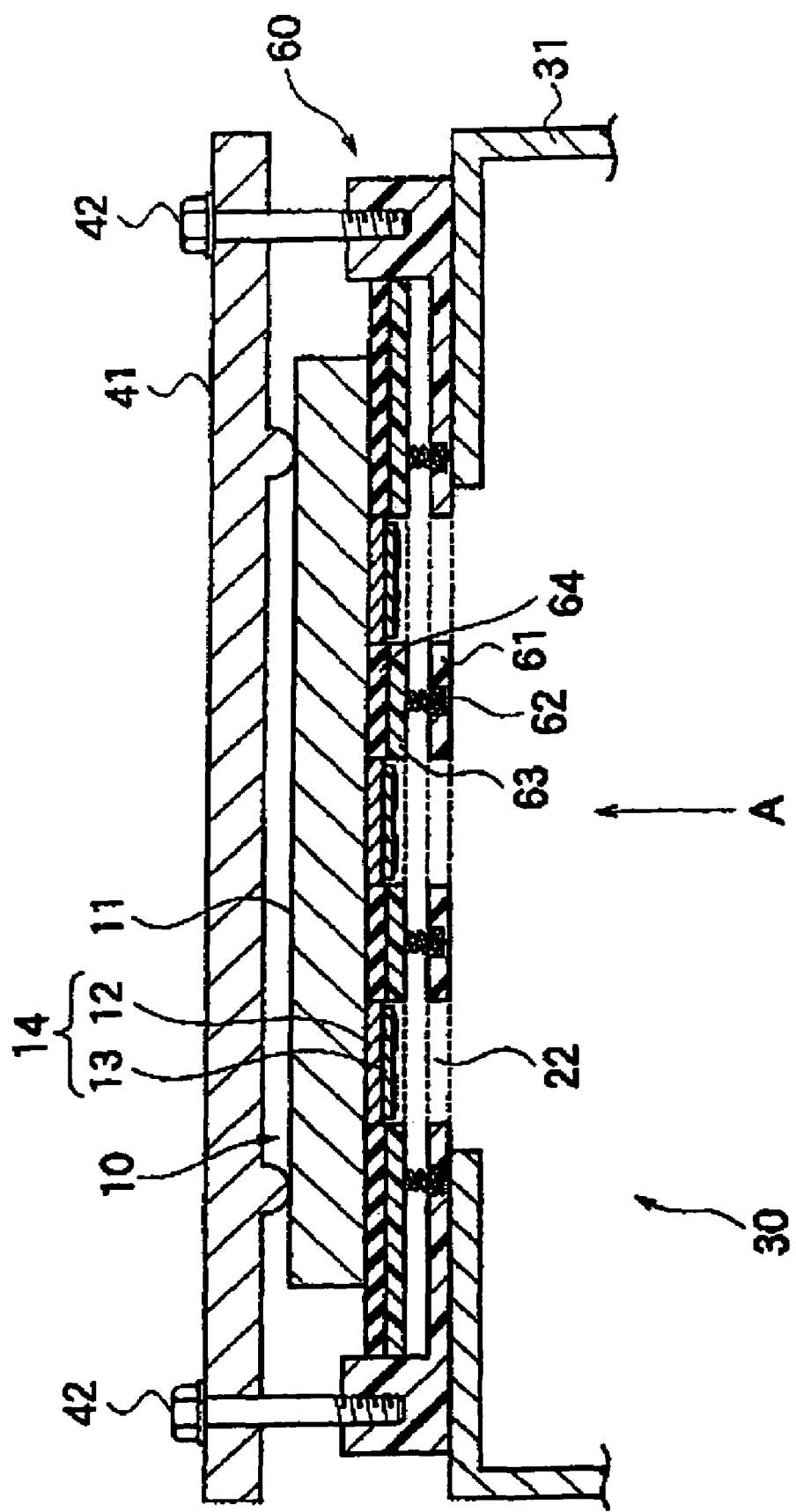
FIG. 8 is a cross sectional view when the integrally bonded member is covered with a masking member according to still another embodiment.
Figure 9:
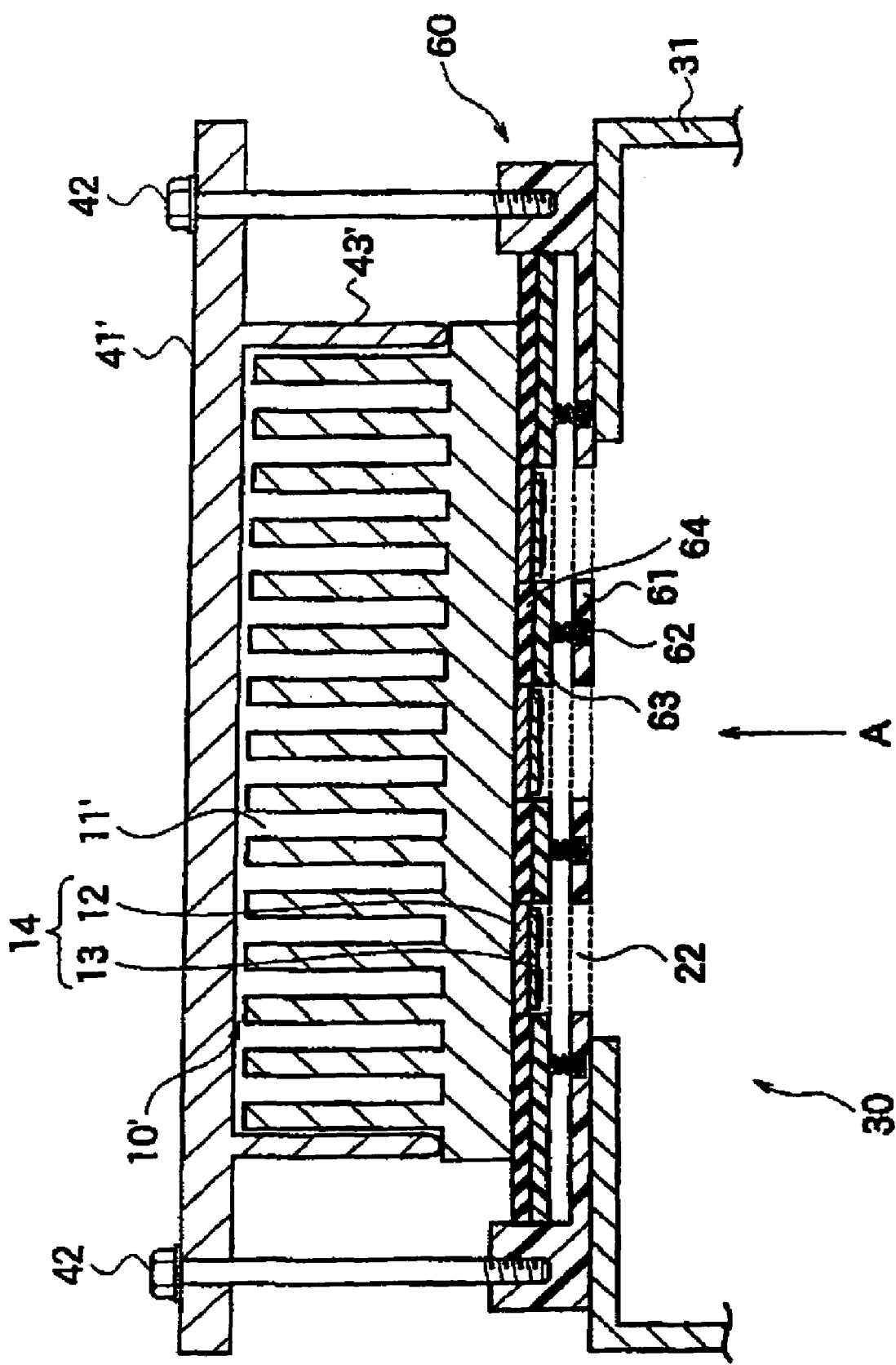
FIG. 9 is a cross sectional view when an integrally bonded member according to yet another embodiment is covered with the masking member.
Figure 10:
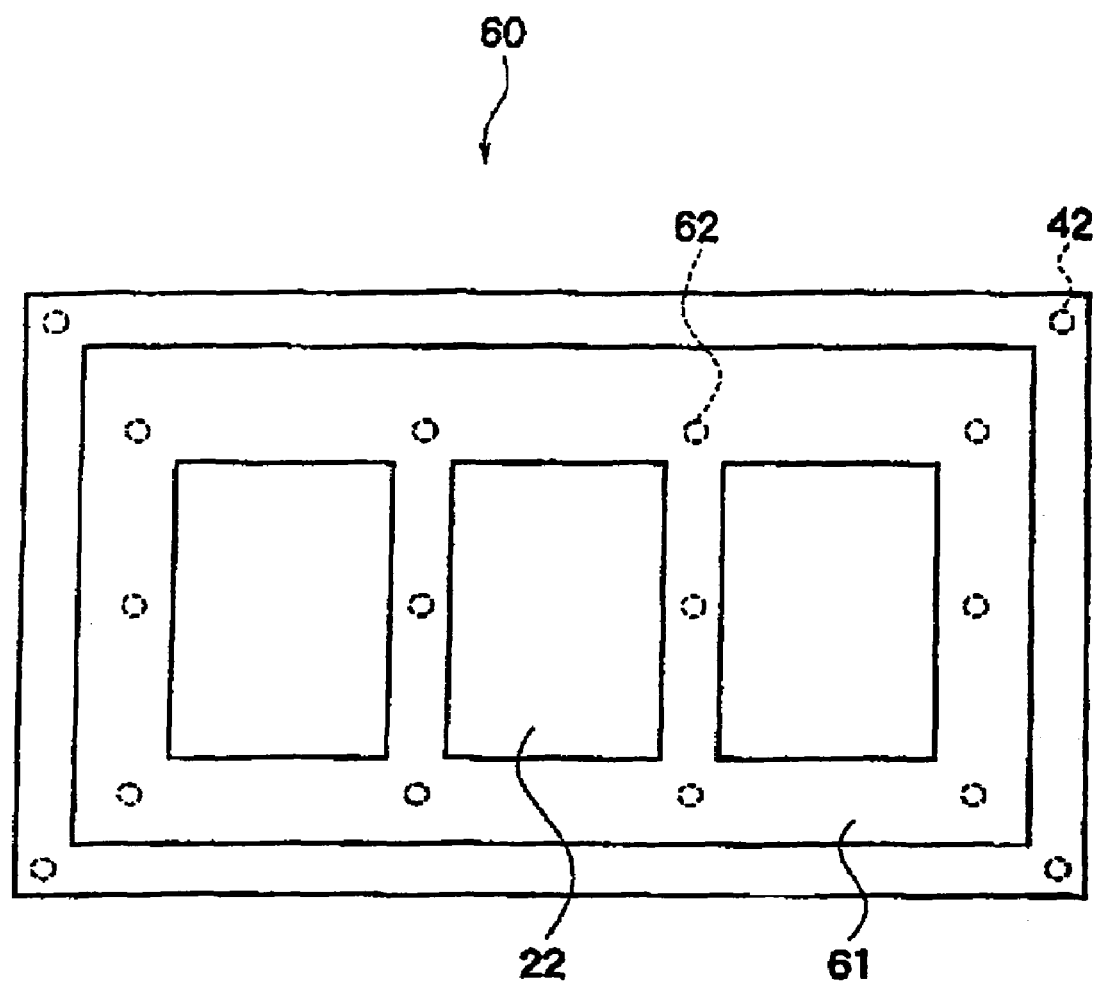
FIG. 10 is a cross sectional view taken along the arrow A in FIG. 8 and FIG. 9.

FIG. 8 is a cross sectional view when the integrally bonded member 10 explained in (Embodiment 1) is covered with a masking member 60 according to still another embodiment, FIG. 9 is a cross sectional view when an integrally bonded member 10' provided with fins is similarly covered with the masking member 60, and FIG. 10 is a cross sectional view of the masking member taken along the arrow A in FIG. 8 and FIG. 9.

First, in FIG. 8, the masking member 60 has a base 61 in which substantially no deformation occurs even when being given a load, a predetermined number of elastic members 62 provided at predetermined places of the base 61, a plate-shaped first pressing portion 63 which is resiliently supported on the base 61 by the elastic members 62 and deforms according to a load of a loaded place, and a plate-shaped second pressing portion 64 which is provided on the first pressing portion 63, deforms according to the load similarly to the first pressing portion 63, and is excellent in liquid sealing.

In the masking member 60, the base 61 has a substantially equal shape to a square measuring box similarly to the masking member 20 explained in (Embodiment 1) or has a plate shape, and has a predetermined number of window portions. The window portions in the same size and at the same positions as the window portions of the base 61 are provided also in the first pressing portion 63 and the second pressing portion 64 to form window portions 22 of the masking member 60. The integrally bonded member 10 in which a predetermined number of metal-ceramic bonded members 14 are bonded is disposed on the second pressing portion 64, and the position and size of the window portions 22 match the position and size of the metal-ceramic bonded members 14. As a result, the circuit pattern forming metal plates 13 of the integrally bonded member 10 disposed in the masking member 60 are exposed to the inside of the treatment tank 31 of the treating apparatus 30 via the window portions 22 of the masking member 60. Meanwhile, the window portions 22 are in contact with the base plate 11 corresponding to a base member surrounding the metal-ceramic bonded members 14 while being in contact with the ceramic substrates 12. Here, in order to press the integrally bonded member 10 against the masking member 60 with an appropriate force, a back board 41 is provided at the back of the base plate 11, the back board 41 and the masking member 60 are fastened with fastening tools 42, and the fastening tools 42 are appropriately fastened.

In this embodiment, the adoption of the above-described structure brings about an effect that undulation on a surface of the base plate 11 on which the metal-ceramic bonded members 14 are bonded can be coped with, in addition to the effects explained in (Embodiment 1) and (Embodiment 2).

Here, explanation will be given on the undulation on the surface of the base plate 11 on which the metal-ceramic bonded members 14 are bonded.

As described above, in the integrally bonded member 10, a desired number of the metal-ceramic bonded members 14 are bonded on the surface of the base plate 11. With the expansion of application of the integrally bonded member 10, the base plate 11 gets upsized and the number of the metal-ceramic bonded members 14 provided thereon is also increased. However, a thermal expansion coefficient of the base plate 11 differs from that of the metal-ceramic bonded member 14, and consequently, distortion due to the difference in the thermal expansion coefficient between these members occurs when the base plate 11 and the metal-ceramic-bonded members 14 are bonded on each other at a high temperature and are cooled to a room temperature, and a force of this distortion sometimes causes the undulation on the surface of the base plate 11.

The masking member explained in (Embodiment 1) or (Embodiment 2) can sufficiently cope with small undulation of the base plate 11, but it is sometimes difficult to cope with the undulation when the undulation exceeds 50 μm. Specifically, even when the masking member is appropriately deformed by the pressing force, gaps occur between the masking member and the metal-ceramic bonded members 14, and the treatment solution enters from these gaps. As a measure to cope with this situation, the use of a choice material for the masking member can be considered, but in consideration of cost and a physical change due to secular deterioration of the choice material, the masking member 60 which is differently structured was devised.

Referring back to FIG. 8 again, each of a predetermined number of the elastic members 62 disposed at the predetermined positions of the base 61 which does not exhibit substantially no deformation even when the load is given thereto as described above independently supports the first and second pressing portions 63, 64 in a resiliently manner, and therefore, the first and second pressing portions 63, 64 are pressed against the base plate 11 so as to deform along the undulation on the surface of the base plate 11.

Here, the fastening tools 42 fastening the base 61 and the back board 41 are appropriately fastened to generate a desired pressing force between the base 61 and the back board 41, and this pressing force is transmitted to the first and second pressing portions 63, 64 via resilient forces of the elastic members 62. Then, the first and second pressing portions 63, 64 are appropriately deformed by this pressing force so that the treatment solution is sealed by the second pressing portion 64 even when the undulation of the base plate 11 is large, which enables the prevention of the treatment solution from entering the masked portions of the integrally bonded member 10.

Next, in FIG. 9, a predetermined number of fins are provided on a surface of a base plate 11' in an integrally bonded member 10' having fins, the surface being opposite a surface on which metal ceramic bonded members 14 are provided. In this case, such a structure may be adopted that a back board 41' provided with long-legged protruding portions 43' is fastened to the masking member 60 using fastening tools 42 and the long-legged protruding portions 43' are pressed against portions of the base plate 11' where the fins are not provided. The adoption of this structure enables the masking member 60 to be pressed against the integrally bonded member 10' having the fins with a desired pressing force without damaging the fins.

Here, preferable arrangement of the elastic members 62 in the masking member 60 will be explained, using FIG. 10.

FIG. 10 is an example of providing the window portions 22 at three places in the masking member 60. The window portions 22 are provided at three places of the base 61, and twelve elastic members 62 are arranged so as to surround the peripheries of the window portions 22. The fastening tools 42 for fastening the base 61 to the back board 41 are provided on four sides of the base 61. Owing to the arrangement of the elastic members 62 around the peripheries of the window portions 22, the permeation of the treatment solution into the masked portions of the integrally bonded member 10 due to the undulation of the base plate 11 can be effectively blocked. The arrangement frequency of the elastic members 62, which may be appropriately determined depending on the size of the undulation of the base plate 11, is preferably increased when the undulation is large.

In FIG. 8 to FIG. 10, the base 61 is preferably rigid resin such as rigid PVC or a thick plate made of corrosion resistant metal since the base 61 is required to have an excellent chemical resistance and suffer substantially no deformation even when a load is given thereto. As the elastic member 62 disposed on this base 61, rubber, a spring, or the like is usable, but a plunger constituted of a cylinder having a spring member therein can be suitably applied. This elastic member 62 is preferably made of resin or corrosion resistant metal since it is also required to have chemical resistance. Further, as the plunger, a short plunger having a reactive force of about 5 N to about 20 N is suitably used.

Since a material deformable along the undulation of the base plate 11 when receiving the pressing force of the elastic members 62, and chemical resistance are required for the first pressing portion 63, the first pressing portion 63 is preferably made of GFRP or the like which is a composite material of resin and glass fiber. Since water repellency, resiliency, and chemical resistance are required for the second pressing portion 64 in order to prevent the intrusion of the treatment solution, various rubber members, especially silicon rubber and the like are suitably used for the second pressing portion 64. Incidentally, it is also preferable that the first and second pressing portions are integrated when an appropriate material is obtainable.

Similarly to (Embodiment 2), as the fastening tool 42, a bolt or the like made of a noncorrosive material such as polyvinyl chloride, polypropylene, or Teflon can be suitably used. Further, instead of using the fastening tools 42, such a structure may be adopted that an appropriate load (about 20 kgf) is given to the integrally bonded member 10 to press it against the masking member 60.

In the foregoing description, (Embodiment 1), (Embodiment 2), and (Embodiment 3) according to the present invention are detailed, but each of the steps in these embodiments is exchangeable with each other. For example, it is possible that the plural integrally bonded members each covered with the masking member described in (Embodiment 1) or (Embodiment 3) are prepared, and while an appropriate pressing force is given thereto, the wet treatment is successively performed in the treating apparatus described in (Embodiment 2). Further, also in the plating performed after the etching process, it is possible to use the masking member and the wet treatment equipment described in any of (Embodiment 1), (Embodiment 2), and (Embodiment 3).

The masking member described in (Embodiment 1) is superior in that the portions not requiring the wet treatment are not subjected to the wet treatment, the masking member described in (Embodiment 2) is superior in that the portions requiring the wet treatment are subjected to the uniform wet treatment, and (Embodiment 3) is superior in that the integrally bonded member having large undulation is subjected to the wet treatment.

When the combination of any of the above was used, since the treatment solution comes in direct contact with an object to be processed, great reduction in the treatment time was achieved, and in addition, the structure as the treating apparatus could be simplified. As a result, reduction in initial cost and running cost of the steps for manufacturing power module members and so on from the metal-ceramic bonded members and the integrally bonded members was achieved, which resulted in cost reduction of power modules manufactured from the power module members and the power module members provided with various kinds of electron devices.

EXAMPLE 1

A sample of the integrally bonded member was prepared which was so structured that a base plate was made of aluminum having a size of 150 mm×80 mm×0.4 mm and a purity of 99.99% or higher, three AlN substrates having a size of 40 mm square×0.635 mm were bonded on this base plate, and aluminum having a size of 38 mm square×0.4 mm and a purity of 99.99% or higher was bonded on each of the AlN substrates as a circuit pattern forming metal plate.

Surfaces of the circuit pattern forming metal plates of this sample of the integrally bonded member were irradiated with UV after coated with an etching resist ink by a printing method so that an etching resist was provided on each of them, while the base plate was subjected to no process.

Next, the sample of the integrally bonded member provided with the etching resist thereon was covered with a masking member, and the circuit pattern forming metal plates were exposed from window portions of the masking member. Then, a back board was provided at the back of the base plate, the back board and the masking member were fastened with polyvinyl chloride bolts, and a portion of the base plate surrounding the ceramic substrates of the sample of the integrally bonded member was pressed against a portion surrounding the window portions in the masking member.

The plural samples of the integrally bonded members each covered with the masking member were prepared, set on guide rails provided on an opening portion in an upper surface of a treating apparatus, with a surface where the circuit pattern forming metal plates were exposed facing downward, and moved successively on the opening portion at a fixed speed. The etching time was set to 25 minutes each.

As an etching solution, an aqueous solution of iron chloride at a liquid temperature of 35° C. was injected from an injection pipe at 1.0 kg/mm$^2$.

As a result, the etching of the base plate after undergoing the aforesaid etching process was on a level unobservable with naked eyes.

EXAMPLE 2

A similar measurement was performed, using the same conditions and apparatus as in the example 1 except that the etching time was set to 30 minutes each and the liquid temperature of the etching solution was set to 30° C.

The result showed that the etching of the base plate after undergoing the aforesaid etching process was on a level unobservable by naked eyes.

COMPARATIVE EXAMPLE

Similarly to the example 1, a sample of an integrally bonded member was prepared, and an etching resist was provided on a surface of each of circuit pattern forming metal plates of this sample of the integrated bonded member, while a base plate was subjected to no process, and an etching process was performed using the treating apparatus provided with the conveyer according to the conventional art.

The composition and liquid temperature of an etching solution were similar to those in the example 1. When an injection pressure from an injection pipe was also set to the same value as that in the example 1, the etching time of 40 minutes was required.

The base plate after undergoing the etching process was extremely etched and on a level unusable as a product.

The present invention relates to a wet treatment method of a metal-ceramic bonded member of a base integral type which is so structured that a metal-ceramic bonded member is bonded on a base plate, the metal-ceramic bonded member being constituted of a ceramic substrate and a circuit pattern forming metal plate bonded on the ceramic substrate, the method comprising: having a masking member cover the metal-ceramic bonded member of the base integral type in which the circuit-pattern forming metal plate is bonded so as to expose an outer peripheral edge portion of the ceramic substrate, the masking member having a window portion from which the circuit pattern forming metal plate is exposed; pressing the masking member against an exposed surface of the ceramic substrate so as to prevent a treatment solution for the wet treatment from passing through a portion where the masking member and the exposed outer peripheral edge portion of the ceramic substrate are in contact with each other; and during pressing the masking member, bringing the treatment solution for the wet treatment of the circuit pattern forming metal plate into contact with the circuit pattern forming metal plate. As a result of the above structure, the contact of the treatment solution with the base plate is avoidable, thereby eliminating the necessity of laminate coating or resist coating onto the whole integrally bonded member and of a correction step thereof.

What is claimed is:

1. A wet treatment method of a metal-ceramic bonded member for wet-treating the metal-ceramic bonded member having a metal circuit plate bonded on one surface of a ceramic substrate by using a wet treatment equipment, the method comprising:

bonding a metal plate for the metal circuit plate to one surface of said ceramic substrate, so that an outer peripheral edge portion of the surface of said ceramic substrate is exposed having a width;

providing a protective pattern having a resistance against etching solution on said metal plate, according to a desired metal circuit pattern;

making a metal-ceramic bonded member covered with a masking member having a square shape with a recessed portion in a center thereof or a plate shape, and having a window portion from which said metal plate is exposed, making the metal-ceramic bonded member covered with said masking member so that said metal plate is exposed and the surface of the outer peripheral edge portion of the ceramic substrate of said metal-ceramic bonded member is brought into contact with a surrounding part of the window portion of said masking member; and installing this metal-ceramic bonded member on an opening part provided in an upper part of said wet-treatment equipment, in a state that a surface exposed from the window portion of said masking member and bonded with said metal plate is directed downward;

pressing a part of the masking member, where the masking member and the outer peripheral edge portion of one surface of the ceramic substrate are in contact with each other, against the outer peripheral edge portion of one surface of the ceramic substrate, by pressing the metal-ceramic bonded member from an opposite side of the surface bonded with the metal plate, wherein a pressing portion forms the window portion; and making a treatment solution for wet-treating the metal circuit plate come in contact with the metal plate to form the desired metal circuit pattern.

2. A wet treatment method of a metal-ceramic bonded member according to claim 1, wherein said treatment solution is an etching solution for said circuit pattern forming metal plate, and wherein the circuit pattern forming metal plate of said metal-ceramic bonded member is covered with the masking member having the window portion from which said circuit pattern forming metal plate is exposed, after a protection pattern having a resistance to said etching solution is formed on a desired portion.

3. A wet treatment method of a metal-ceramic bonded member according to claim 2, wherein an appropriate resist is applied to or an appropriate film is laminated on said circuit pattern forming metal plate to form said protection pattern.

4. A wet treatment method of a metal-ceramic bonded member type according to claim 1, wherein said treatment solution is a plating solution for said circuit pattern forming metal plate.

5. A wet treatment method of a metal-ceramic bonded member type according to claim 1, wherein said treatment solution is a plating solution for said circuit pattern forming metal plate, and wherein the circuit pattern forming metal plate of said metal-ceramic bonded member is covered with the masking member having the window portion from which said circuit pattern forming metal plate is exposed, after a protection pattern preventing plating with said plating solution is formed on a desired portion.

6. The wet treatment method of a metal-ceramic bonded member according to claim 1, which uses the masking member having a base part not liable to substantially become deformed even if a load is applied, prescribed numbers of elastic members set in prescribed places of the base part, and a pressing part that becomes deformed in accordance with the load when elastically supported on the base part and the load is applied.

7. The wet treatment method of the metal-ceramic bonded member according to claim 1, wherein a width of an outer peripheral edge portion of one side of the metal-ceramic bonded member is set at 0.5 mm to 1.5 mm, and by pressing the part where the masking member and the outer peripheral edge portion of one side of the ceramic substrate are in contact with each other, against the outer peripheral edge portion of one side of the ceramic substrate.

8. The wet treatment method of the metal-ceramic bonded member according to claim 1, wherein the masking member is composed of any one of silicon rubber, fluorine rubber, polypropylene or teflon.

9. A wet treatment method of a metal-ceramic bonded member for wet-treating a base integral type metal-ceramic bonded member having a metal circuit plate bonded on one surface and a base member bonded on the other surface of a ceramic substrate, by using a wet treatment equipment, the method comprising:

bonding a metal plate for the metal circuit plate to one surface of said ceramic substrate, so that an outer peripheral edge portion of the surface of said ceramic substrate is exposed, having a width;

bonding a base member to the other surface of said ceramic substrate so that said base member is exposed, providing a protective pattern having a resistance against etching solution on said metal plate, according to a desired metal circuit pattern;

making a base plate, being a base member of an outer periphery of the ceramic substrate of said metal-ceramic bonded member, covered with a masking member having a square shape provided with a recessed portion in a center thereof or a plate shape, and having a window portion from which said metal plate and said ceramic substrate are exposed, so that said metal plate is exposed and a surrounding part of the window portion of said masking member is brought into contact with this base plate;

installing this metal-ceramic bonded member on an opening part provided in an upper part of said wet-treatment equipment, in a state that a surface exposed from the window portion of said masking member and bonded with said metal plate is directed downward;

pressing a part of the masking member, where the masking member and the base plate are in contact with each other, against the base member of the outer peripheral edge portion of said ceramic substrate, by pressing the metal-ceramic bonded member from an opposite side of the surface bonded with the metal plate; and making a treatment solution for wet-treating the metal plate come in contact with the metal plate to form the desired metal circuit pattern.

10. A wet treatment method of a metal-ceramic bonded member of a base integral type according to claim 9, wherein said base member has a plate shape or a fin structure.

11. A wet treatment method of a metal-ceramic bonded member and a metal-ceramic bonded member of a base integral type according to claim 9, wherein said treatment solution is an etching solution for said circuit pattern forming metal plate, and wherein the circuit pattern forming metal plate of said metal-ceramic bonded member is covered with the masking member having the window portion from which said circuit pattern forming metal plate is exposed, after a projection pattern having a resistance to said etching solution is formed on a desired portion.

12. A wet treatment method of metal-ceramic bonded member and a metal-ceramic bonded member of a base integral type according to claim 9, wherein said treatment solution is a plating solution for said circuit pattern forming metal plate.

13. A wet treatment method of a metal-ceramic bonded member and a metal-ceramic bonded member of a base integral type according to claim 9, wherein said treatment solution is a plating solution for said circuit pattern forming metal plate, and wherein the circuit pattern forming metal plate of said metal-ceramic bonded member is covered with the masking member having the window portion from which said circuit pattern forming metal plate is exposed, after a protection pattern preventing plating with said plating solution is formed on a desired portion.

14. The wet treatment method of a metal-ceramic bonded member according to claim 9, which uses the masking member having a base part not liable to substantially become deformed even if a load is applied, prescribed numbers of elastic members set in prescribed places of the base part, and a pressing part that becomes deformed in accordance with the load when elastically supported on the base part and the load is applied.

15. The wet treatment method of the metal-ceramic bonded member according to claim 9, wherein a width of an outer peripheral edge portion of one side of the metal-ceramic bonded member is set at 0.5 mm to 1.5 mm, and by pressing the part where the masking member and the outer peripheral edge portion of one side of the ceramic substrate are in contact with each other, against the outer peripheral edge portion of one side of the ceramic substrate.

16. The wet treatment of method of the metal-ceramic bonded member according to claim 9, wherein the masking member is composed of any one of silicon rubber, fluorine rubber, polypropylene or teflon.

\* \* \* \* \*